United States Patent [19]
Koga et al.

[11] Patent Number: 5,563,541
[45] Date of Patent: Oct. 8, 1996

[54] LOAD CURRENT DETECTION CIRCUIT

[75] Inventors: Katsuhiro Koga, Tokyo; Hiroyuki Kano, Kodaira, both of Japan

[73] Assignee: Sony/Tektronix Corporation, Tokyo, Japan

[21] Appl. No.: 439,193

[22] Filed: May 11, 1995

[30] Foreign Application Priority Data

May 31, 1994 [JP] Japan ................................. 6-140989
May 19, 1994 [JP] Japan ................................. 6-129752

[51] Int. Cl.⁶ ................................................. H03K 17/16
[52] U.S. Cl. ...................... 327/380; 327/310; 327/384; 361/2; 361/13; 307/137
[58] Field of Search ............................. 327/379–381, 327/383–385, 310, 387–389; 363/26, 15, 56; 326/26, 27, 33; 361/2–13

[56] References Cited

U.S. PATENT DOCUMENTS

| | | | |
|---|---|---|---|
| 4,716,398 | 12/1987 | Eccleston et al. | 327/379 |
| 4,771,195 | 9/1988 | Stein | 327/389 |
| 4,808,861 | 2/1989 | Ehni | 327/389 |
| 4,890,021 | 12/1989 | Walker | 327/389 |

FOREIGN PATENT DOCUMENTS

| | | | |
|---|---|---|---|
| 60-123132 | 7/1985 | Japan | 327/385 |
| 64-8310 | 2/1989 | Japan . | |
| 2-192215 | 7/1990 | Japan | 327/384 |

Primary Examiner—Timothy P. Callahan
Assistant Examiner—Kenneth B. Wells
Attorney, Agent, or Firm—Smith-Hill and Bedell

[57] ABSTRACT

A load current detection circuit restrains the generation of noise spikes with a minimum of circuitry when changing between current detection sensitivity ranges by providing a plurality of sensitivity resistors between the output of a voltage source, such as a negative feedback voltage amplifier, and a load. Sensitivity range changing is performed via switches that increase or decrease the number of sensitivity resistors between the voltage source and the load. When a current detection sensitivity change is commanded, a voltage difference across the sensitivity resistors is measured, and a control processor generates a control voltage for changing voltage difference gradually until the voltage difference is zero without changing the voltage across the load. The sensitivity range switching then occurs when no current flows through the sensitivity resistors so that no noise spikes are produced. Then the control voltage is gradually changed until the full load current passes through the selected sensitivity resistors.

11 Claims, 6 Drawing Sheets

LOAD CURRENT DETECTION CIRCUIT

BACKGROUND OF THE INVENTION

The present invention relates to load current detection circuits, and in particular to a load current detection circuit capable of changing its detection sensitivity by switching resistors while restraining the generation of noise spikes with minimal circuitry.

A load current detection circuit applies a predetermined voltage, proportional to an input voltage applied to an input amplifier, to a load and detects a voltage across a current detection resistor connected to the load in series in order to determine the current through the load from the predetermined voltage. In this circuit current detection resistors are switched to change current detection sensitivity as the load current changes in response to the voltage applied to the load or in response to the impedance of the load. However, when the current detection resistors are switched, a noise spike may be generated due to the response delay of the input amplifier. If the load is a semiconductor device, it may be damaged by the noise spike.

Japanese Patent Publication No. 64-8310 describes a conventional current detection circuit with a resistor switching circuit where generation of noise spikes is restrained. With this circuit an input voltage is applied to an inverting input of an operational amplifier having a high gain through an input resistor. An output current from the operational amplifier is applied to a load through a first current detection resistor and through a series circuit including a field effect transistor (FET), a second current detection resistor, and a first switch. The series circuit is connected in parallel with the first current resistor. The gate of the FET is connected to one terminal of a sawtooth signal generator which has another terminal connected to a common terminal of a second switch. The common terminal of the second switch is selectively connected to a first contact connected to the output of the operational amplifier, a second contact connected to an output of a voltage follower circuit and a third contact connected to a reference potential point. The voltage produced at the load also is applied to the inverting input of the operational amplifier through the voltage follower circuit and a third resistor for negative-feedback operation so that the voltage corresponding to the input voltage is applied to the load.

In operation the first switch is turned on while the FET is turned off by adjusting the output voltage of the sawtooth generator to be its maximum negative voltage. Then the output voltage of the saw tooth generator is increased at a constant rate smaller than the slew rate of the operational amplifier. The increase of current through the FET increases the voltage across the load, i.e., the load voltage. The output voltage of the operational amplifier decreases in response to the increase of the load voltage so that the gate voltage of the FET is kept at the pinch-off voltage to turn off the FET. Thus, since the current detection resistors are switched slowly, any noise spike is not applied to the load circuit.

However, this circuit needs multiple circuits consisting of an FET, a current detection resistor, a switch and a sawtooth generator, one for each sensitivity range. It may be possible to use one sawtooth generator for a plurality of FETs, but the gate of the FETs not connected to the sawtooth generator must be connected to a voltage source to keep the FETs in an off-state. Therefore the number of components increases as the number of switching ranges increases, raising the manufacturing cost.

What is desired is a load current detection circuit capable of restraining generation of noise spikes, produced when switching current detection sensitivity, which uses fewer components.

SUMMARY OF THE INVENTION

Accordingly the present invention provides a load current detection circuit having an architecture for restraining the generation of noise spikes. The circuit uses a plurality of series resistors for selecting current detection sensitivity. A negative feedback voltage amplifier provides a load voltage. The plurality of resistors form a current detection sensitivity selection circuit, and are connected between the load and the output of the voltage amplifier, the voltage amplifier being connected to a floating potential. A voltage detection circuit detects a voltage difference across the current detection sensitivity selection circuit and applies the voltage difference to an analog-to-digital converter (ADC). A control processor provides the output data from the ADC to a digital-to-analog converter(DAC). The output voltage from the DAC is substantially equal to the load voltage, so no noise spike is generated even when a first switch, connected between the load and the DAC, is switched off. The control processor gradually changes the output voltage of the DAC to the floating potential. A second switch connected across one of the resistors is switched on to change the current detection sensitivity. At this time no noise spike is generated since there is no voltage difference across the first switch. The control processor then changes the output voltage of the DAC to a value equal to the load voltage. The first switch then is switched off. At this time also no noise spike is generated since there is no voltage difference across the first switch.

The objects, advantages and other novel features of the present invention are apparent from the following detailed description when read in conjunction with the appended claims and attached drawing.

DESCRIPTION OF THE PREFERRED EMBODIMENT

Figure 1:
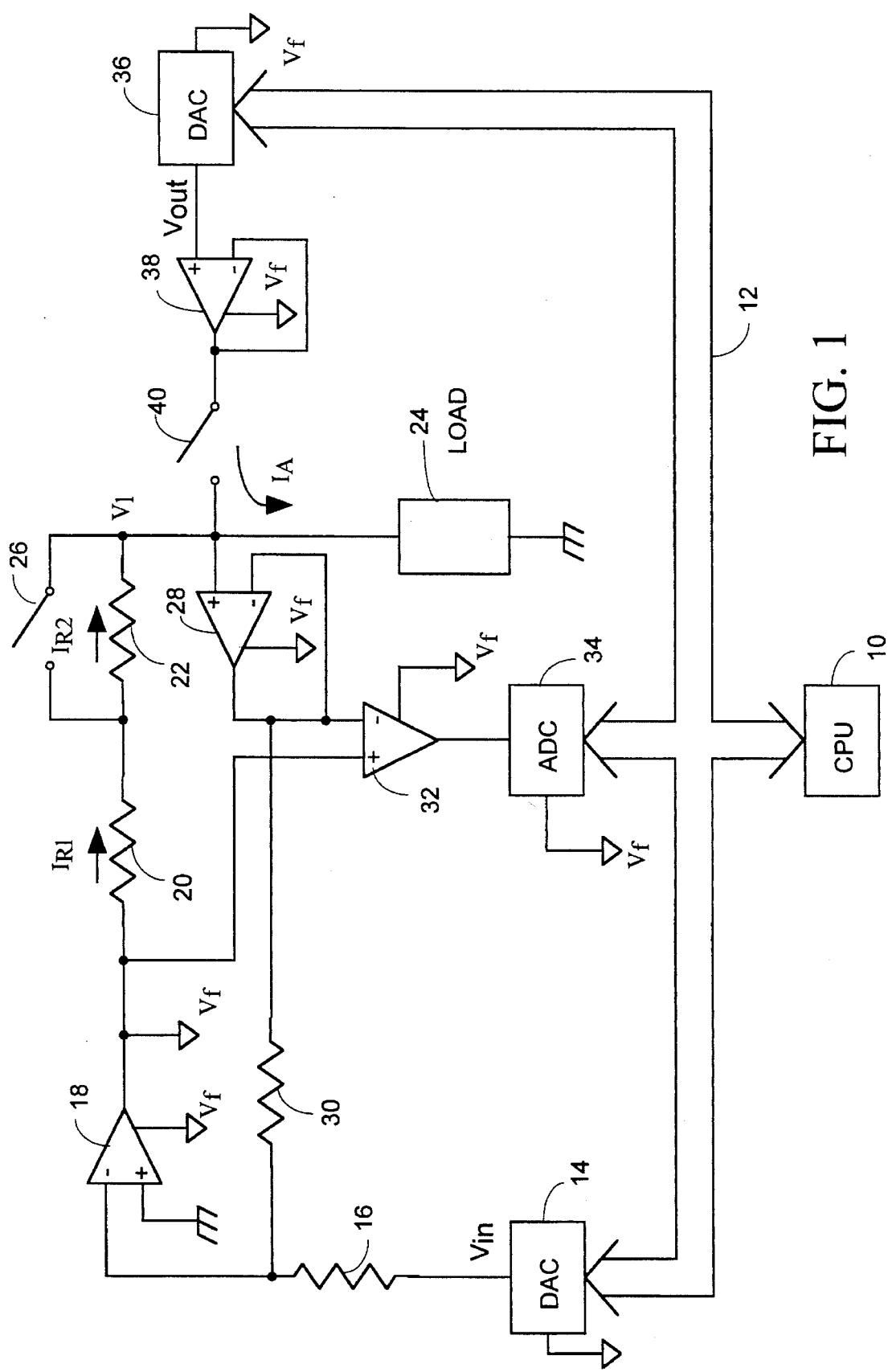
FIG. 1 is a circuit diagram of a load current detection circuit according to the present invention.

Referring now to FIG. 1 a circuit diagram of a load current detection circuit is shown having a central processor unit (CPU) or control processor 10 as a control means. The CPU 10 communicates with other components of the load current detection circuit through a bus 12 and operates switches in response to input commands from a conventional interface (not shown).

A digital-to-analog converter (DAC) 14 receives digital voltage data from the CPU 10 in accordance with an input command. The DAC 14 converts the digital voltage data into a corresponding analog input voltage Vin which is applied to an inverting input terminal of a high gain operational amplifier 18 through an input resistor 16. The output of the operational amplifier 18 is coupled to one end of a load 24, the other end of the load being at a fixed potential such as ground, through series-connected sensitivity resistors 20, 22. A first switch 26 is connected across one of the resistors. The current detection sensitivity is selectively changed by closing (rendering conductive) or opening (rendering nonconductive) the switch 26. A load voltage Vl, applied by the operational amplifier 18 to the load 24, also is coupled to the inverting input of the operational amplifier through a voltage follower circuit 28 and a feedback resistor 30 to provide negative feedback operation. Assuming that the input and feedback resistors 16, 30 have respective resistance values R1, R2, the load voltage Vl is proportional to the input voltage Vin, i.e., $Vl=(-R2/R1)*Vin$.

The inverting input terminal of a differential amplifier 32, which acts as a voltage detector, is coupled to the output of the voltage follower 28. The non-inverting input of the differential amplifier 32 is coupled to the output of the operational amplifier 18 in order to detect a voltage across the sensitivity resistors 20, 22 and first switch 26. The detected voltage is provided to an analog-to-digital converter (ADC) 34 to be converted into digital data, the digital data being provided to the CPU 10 over the bus 12. A second DAC 36 converts digital data from the CPU 10 over the bus 12 as described below into an analog voltage, the analog voltage being provided to the load 24 through a second voltage follower 38 and second switch 40.

The DACs 14, 36, the voltage followers 28, 38, the differential amplifier 32 and the operational amplifier 18 operate with reference to a floating potential Vf. The floating potential also is applied to the output of the operational amplifier 18 which is coupled to the non-inverting input of the differential amplifier 32. Thus, even when an excessive high voltage is applied to the load 24 for high voltage measurements, the in-phase components of the input voltages to the differential amplifier 32. increase to prevent the differential amplifier from being damaged.

Figure 2:
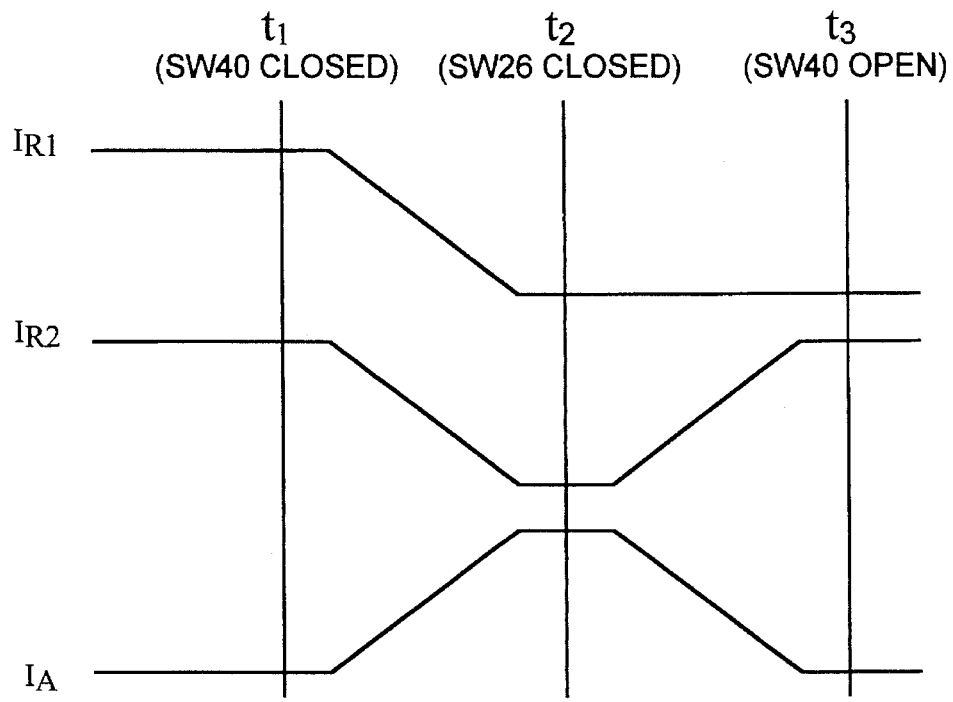
FIG. 2 is a timing chart for illustrating the operation of the circuit of FIG.1.
Figure 3:
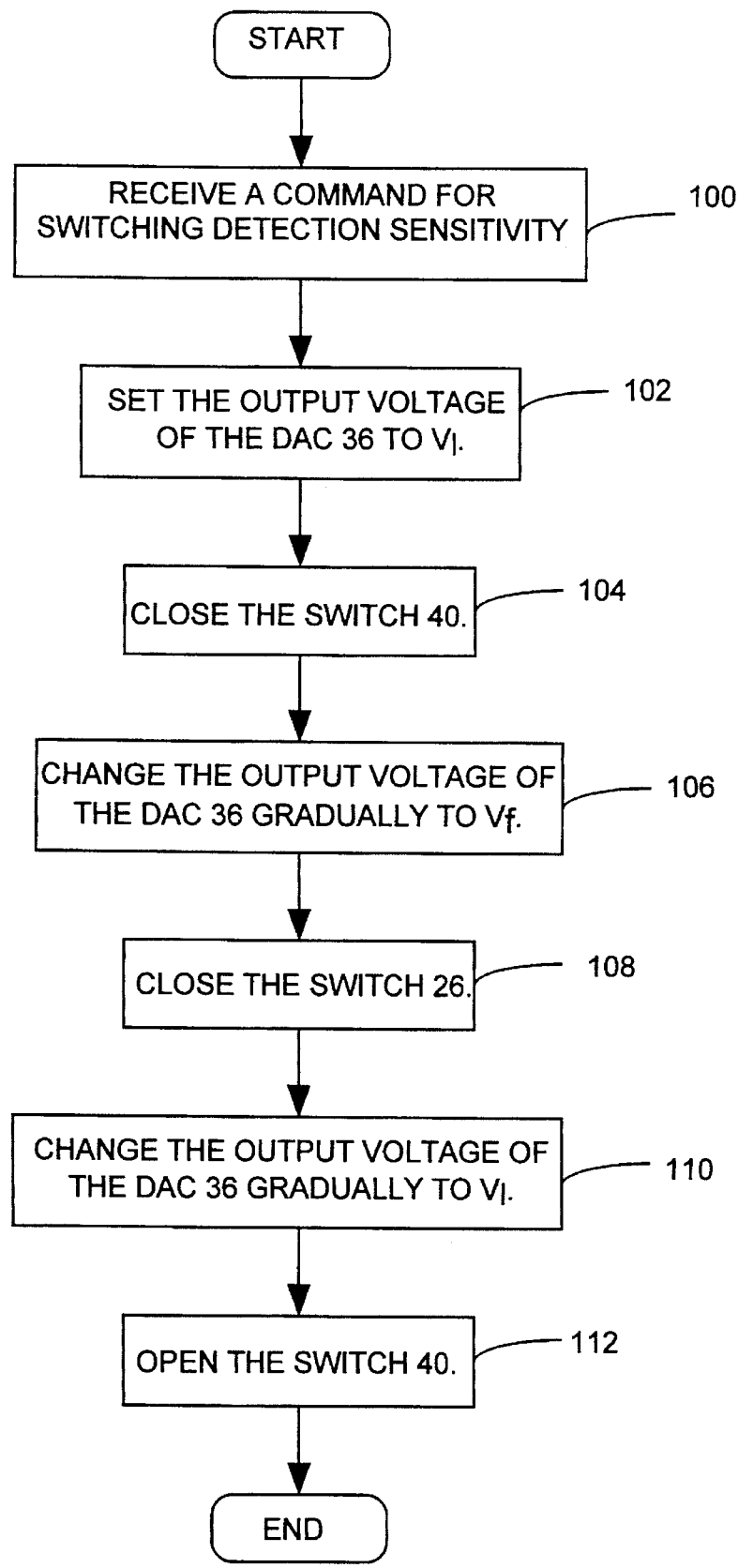
FIG. 3 is a flow chart for describing the operation of the circuit of FIG.1.

FIGS. 2 and 3 show a timing chart and a flow chart for the operation of the circuit of FIG. 1, as described below. Assuming that in an initial state the switches 26, 40 are both open then the first switch 26 needs to be closed to decrease the current detection sensitivity. When the CPU 10 receives the input command to decrease the current detection sensitivity (Step 100), it receives digital data representing the difference voltage Vl−Vf from the ADC 34 and provides digital data to the second DAC 36 to provide an analog output voltage Vout substantially equal to voltage V1 (Step 102). Then the CPU 10 closes the second switch 40 at time t1 (Step 104) so that the output voltage Vout from the second DAC 36 is provided to the load 24 through the second voltage follower 38 and switch 40. Since the voltage Vout= Vl is provided to the load 24 prior to time t1, there is no voltage difference across the second switch 40, so no noise spike is generated when switching the second switch.

The CPU 10 changes the digital data applied to the second DAC 36 to gradually change the output voltage Vout at a rate sufficiently slower than the slew rate of the operational amplifier 18 until the output voltage equals the floating potential Vf (Step 106). Since the voltage across the sensitivity resistors 20, 22 decreases as the output voltage of the second DAC 36 gets closer to the floating potential Vf, the currents $I_{R1}$, $I_{R2}$ flowing through the sensitivity resistors decrease. The positive or negative current $I_A$ flowing from the second voltage follower 38 to the load 24 increases because of the decrease of the currents $I_{R1}$, $I_{R2}$ thereby keeping the load voltage Vl constant. When the output voltage Vout from the second DAC 36 equals the floating potential Vf, then the currents $I_{R1}$, $I_{R2}$ flowing through the sensitivity resistors 20, 22 are zero. At time t2 the CPU 10 closes the first switch 26. Now since the potentials at both ends of the sensitivity resistors 20, 22 are equal to the floating potential Vf, there is no voltage difference across the resistors so that no noise spike is generated when closing the first switch 26 (Step 108). If in the initial state the first switch 26 is closed and the current sensitivity is to be increased, the first switch is opened. In this case also no noise spike is generated.

The CPU 10 changes the digital data provided to the second DAC 36 to gradually change the output voltage from the second DAC at a rate sufficiently slower than the slew rate of the operational amplifier 18 until the output voltage rout equals the load voltage Vl again (Step 110). Since the voltage across the first sensitivity resistor 20 increases as the output voltage Vout gets closer to the load voltage Vl, the current $I_{R1}$ increases. The current $I_A$ flowing from the second voltage follower 38 to the load 24 decreases because of such increase of the current $I_{R1}$, so the load voltage Vl is kept constant. When the output voltage from the second DAC 36 equals the load voltage Vl, the current $I_A$ is zero. Therefore, the digital data that the second DAC 36 receives from the CPU 10 to provide the voltage Vl is different from that at time t1.

When the second switch 40 is open at time t3 by the CPU 10 (Step 112), a noise spike due to the switching of the second switch 40 is not generated since there is no potential difference across the switch. Thus, the generation of noise spikes during the switching of current detection sensitivity is restrained.

Figure 4:
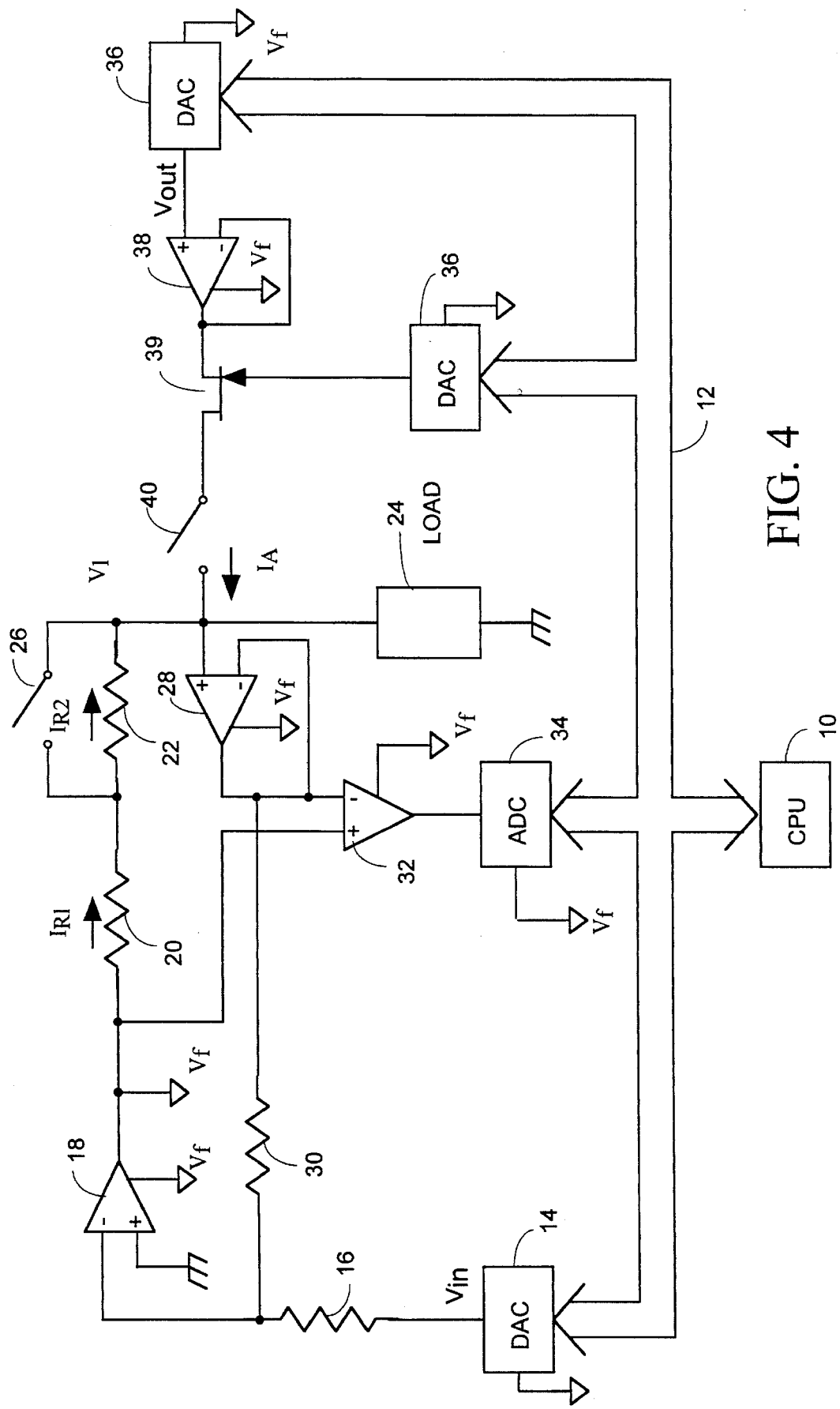
FIG. 4 is a circuit diagram of the load current detection circuit according to another embodiment of the present invention.

FIG. 4 shows a circuit diagram of the load current detection circuit for another embodiment according to the present invention. This circuit includes a field effect transistor (FET) 39 and a third DAC 42 in addition to the circuit shown in FIG. 1. The FET 39 is inserted between the second voltage follower circuit 38 and second switch 40 by coupling the source of the FET to the output of the second voltage follower and the drain to the switch. The gate of the FET 39 is coupled to the output of the third DAC 42 which converts digital data from the CPU 10 into an analog voltage.

Figure 5:
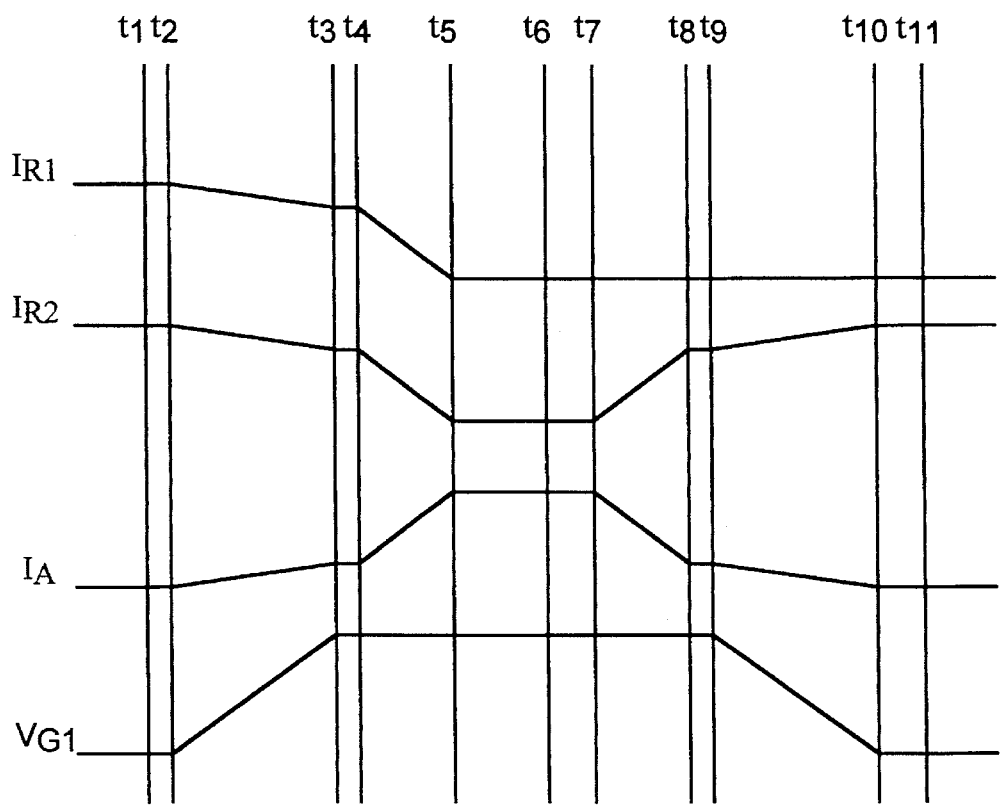
FIG. 5 is a timing chart for illustrating the operation of the circuit of FIG.4.
Figure 6:
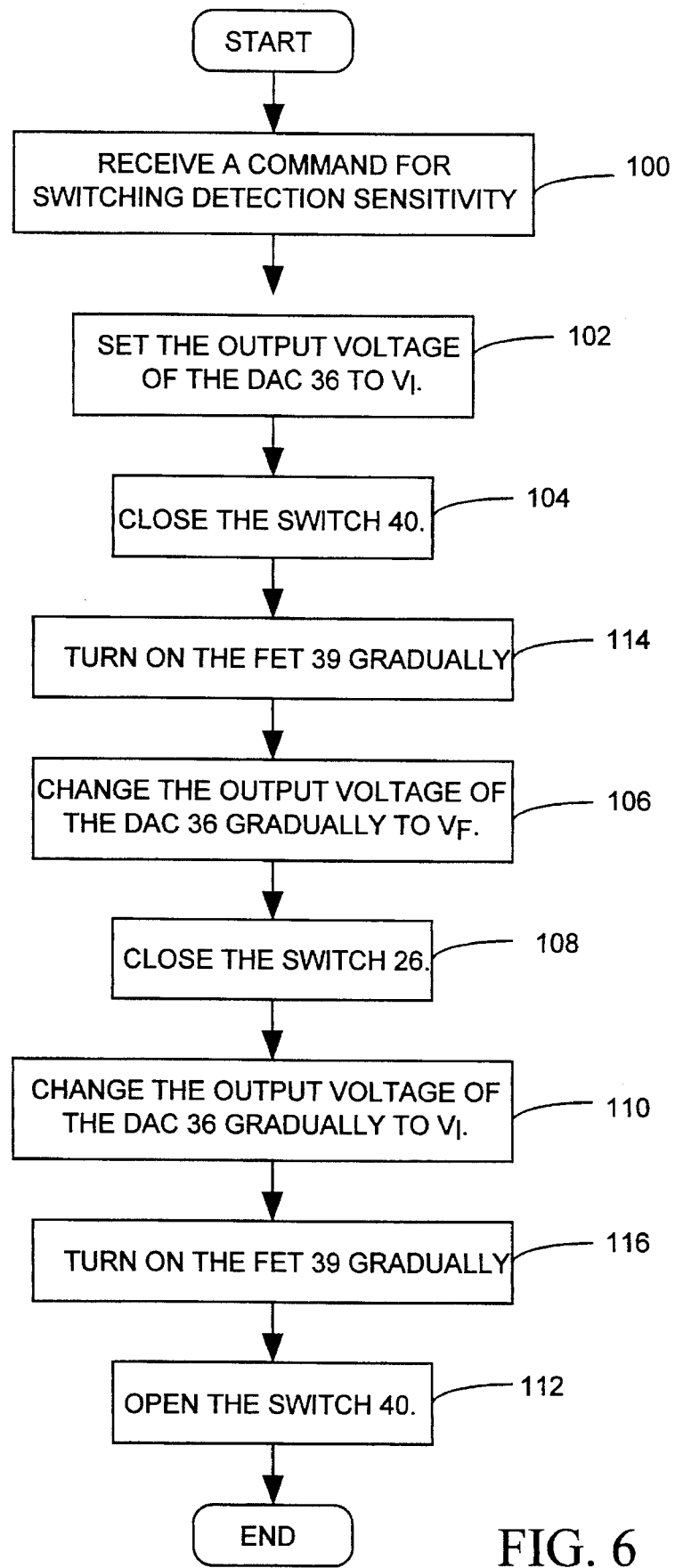
FIG. 6 is a flow chart for describing the operation of the circuit of FIG.4.

FIGS. 5 and 6 show a timing chart and a flow chart for the operation of the circuit in FIG. 4. The steps in FIGS. 3 and 6 represented by the same numbers are identical to each other. In addition to the steps in FIG. 3, FIG. 6 adds step 114 between steps 104, 106 and step 116 between steps 110, 112. Assuming that in the initial state switches 26, 40 are both open, then the first switch 26 needs to be closed to decrease the current detection sensitivity. At this time the FET 39 is held off by a negative voltage at the gate provided by the third DAC 42. When the CPU 10 receives the input command to decrease the current detection sensitivity (Step 100), it receives digital data representing the voltage difference Vl−Vf from the ADC 34 and provides digital data to the second DAC 36 which converts the digital data into the analog output voltage Vout (Step 102). However, the input digital data may include a digital error such that the output voltage Vout may not exactly be equal to the load voltage Vl. This may cause a little noise spike when closing or opening the second switch 40.

After closing the second switch 40 at time t1 (Step 104), the CPU 10 begins increasing at time t2 the output voltage from the third DAC 42, i.e. the gate voltage VG1 of the FET 39 increases gradually, for example at a rate of 5 V/200 ms. When the FET 39 turns on at the time t3 (step 104), the output voltage Vout of the second DAC 36 is provided to the load 24 through the source and drain connection of the FET 39 and the second switch 40. The output voltage Vout is slightly different from the load voltage Vl due to the digital error as described above. For example, the currents $I_{R1}$, $I_{R2}$ flowing the sensitivity resistors 20,22 gradually decrease during the time interval from the time t2 to t3. The current $I_A$ gradually increases in response to the decrease of the currents $I_{R1}$, $I_{R2}$, so that the load voltage Vl in reference to ground level is kept constant. Thus, since the current $I_A$ gradually changes while the FET 39 is changing from the off-state to the on-state, no noise spike is generated.

As described with respect to the operation of FIG. 1, the CPU 10 begins changing the output digital data to the second DAC 36 to change the output voltage Vout starting at time t4 until it equals the floating potential Vf at the time t5 (Step 106). The CPU 10 closed the first switch 26 at time t6. At this time no noise spike is generated since there is no potential difference across the first switch 26.

The CPU 10 changes the output digital data to the second DAC 36 to gradually change the output voltage Vout to make it close to the load voltage Vl (Step 110) at time t7. The digital data is changed to reach the value at time t8 corresponding to the voltage produced when all the load current flows the first sensitivity resistor 20 only. The output voltage Vout may not equal the voltage Vl due to the digital error. Since the voltage across the first sensitivity resistor 20 as the output voltage gets closer to the voltage Vl increases, the current $I_{R2}$ increases. The current $I_A$ decreases because of such increase of the current $I_{R2}$, keeping the load voltage Vl constant. The difference between the voltages V1 and Vout causes a slight current to flow.

The CPU 10 begins decreasing the gate voltage VG1 of the FET 39 gradually at time t9. As a result the current $I_A$ decreases and turns to zero when the FET 39 turns off at time t10. When the second switch 40 is opened at time t11, no noise spike is generated.

Figure 7:
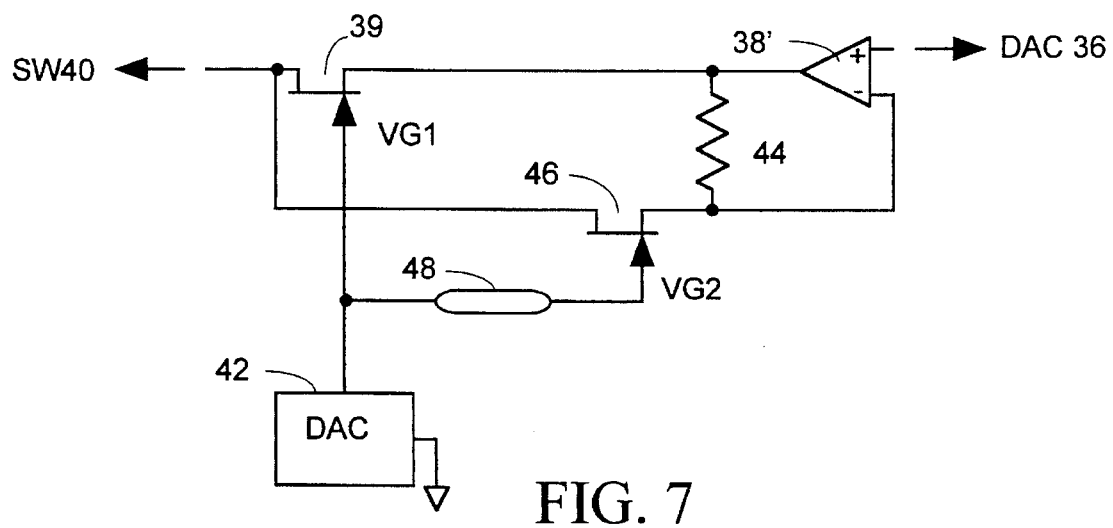
FIG. 7 is a circuit diagram for partially modifying the circuit of FIG.4.

FIG. 7 shows a circuit for compensating for the voltage drop between the drain and the source of the FET 39 in FIG. 4. In this circuit the inverting input of the operational amplifier 38' which is used for the voltage follower 38 is connected to its output through a high resistance resistor 44 and to the source of a second FET 46. The drain of the second FET 46 is connected to the drain of the first FET 39 and the gate is connected to the output of the third DAC 42 through a delay device 48.

Figure 8:
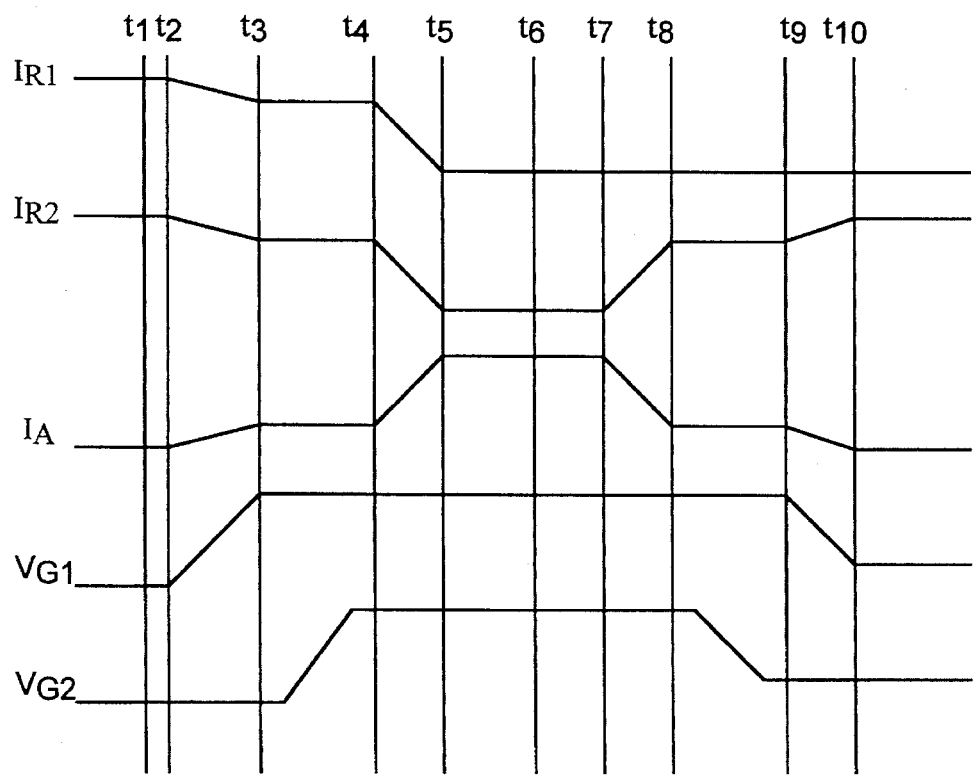
FIG. 8 is a timing chart for illustrating the operation of the circuit as modified by the circuit of FIG. 7.

FIG. 8 shows a timing chart for the operation of FIG. 4 including the modified circuit shown in FIG. 7. All timing relations except the gate VG2 of the second FET 46 are the same as in FIG. 5. The delay device 48 has a delay time a little longer than the time interval between times t2 and t3 when the gate voltage VG1 increases, and the gate voltage VG2 of the second FET 46 increases during the time interval between times t3 and t4. In other words the second FET 46 turns on after the first FET 39 turns on and the drain voltage of the first FET 39 is fed back to the inverting input of the operational amplifier 38'. The drain voltage of the first FET 39 equals the input voltage of the operational amplifier 38' by the negative feedback action of the operational amplifier, and the voltage drop due to FET-on resistance is compensated for. The gate voltage VG2 decreases from the time t8 to time t9 to turn off the second FET 46 before the first FET 39 turns off.

Thus the present invention provides a load current detection circuit that changes detection sensitivity by changing incrementally the series resistance between the output of an operational amplifier and a load, the series resistance being used as a current detector.

What is claimed is:

1. A load current detection circuit comprising:

a voltage source means having an input terminal, a feedback terminal and an output terminal, said voltage source means providing an output voltage at the output terminal in response to both an input voltage at the input terminal and a feedback voltage at the feedback terminal, a plurality of sensitivity resistors connected in series between the output terminal of the voltage source means and a load terminal for applying a load voltage to the load terminal, a feedback means coupling the load terminal to the feedback terminal, whereby the feedback voltage is equal to the load voltage, a switch coupled across one of the sensitivity resistors, the switch having two states, a voltage detecting means for detecting a voltage difference across the sensitivity resistors, and a control means responsive to said voltage difference and to a command to change the state of the switch, said control means being coupled to the load terminal and being operative to zero the voltage difference, change state of the switch, and bring the voltage difference to a desired value while maintaining the load voltage constant.

2. A load current detection circuit according to claim 1, wherein the control means comprises:

a control processor, a first conversion means coupled between the voltage detecting means and the control processor for converting the voltage difference to digital data, a second conversion means coupled between the control processor and the load for converting digital control data to a control voltage, and a means for coupling the control voltage to the load.

3. A load current detection circuit according to claim 2, wherein the coupling means comprises:

a voltage follower circuit having the control voltage as an input and a control current as an output, and a second switch coupled between the voltage follower circuit and the load terminal for applying the control current to the load to maintain the load voltage constant as the voltage difference changes.

4. A load current detection circuit according to claim 3, wherein the coupling means further comprises:

a third switch coupled between the voltage follower circuit and the second switch, and a means for generating a slope signal to control changing the third switch between two states.

5. A load current detection circuit according to claim 4, wherein the coupling means further comprises:

a fourth switch coupled between the second switch and an inverting input of the voltage follower circuit to provide negative feedback, and a means coupled between the generating means and the fourth switch for delaying the slope signal so that the fourth switch changes between states in a delayed fashion with respect to the third switch.

6. A load current detection circuit according to claim 5, wherein the voltage source means, the voltage detecting means, the control means, the converting means, the voltage follower circuit, and the generating means each have a reference terminal, said reference terminals being connected to a floating potential.

7. A load current detection circuit according to claim 1, wherein the voltage source means, the voltage detecting means, and the control means each have a reference terminal, said reference terminals being connected to a floating potential.

8. A load current detection circuit according to claim 7, wherein the voltage source means is an operational amplifier and said output terminal is connected to said floating potential.

9. A method of selecting current detection sensitivity for a load current detection circuit comprising the steps of:

provinding a plurality of sensitivity resistors and a voltage source means having an output terminal, the sensitivity resistors being connected in series between the output terminal of the voltage means and a load terminal that is connected to a load, in response to a current detection sensitivity change command, setting a control voltage equal to a load voltage at the load terminal, closing a first switch to couple the control voltage to the load terminal, changing the control voltage until the voltage difference across the sensitivity resistors equals zero, activating a second switch to change the number of sensitivity resistors coupled between said output terminal and said load terminal, changing the control voltage to equal the load voltage, and opening the first switch to decouple the control voltage from the load.

10. A method according to claim 9, further comprising the steps of:

after closing the first switch and before changing the control voltage to bring the voltage difference to zero, closing a third switch coupled to apply the control voltage to the first switch, and after changing the control voltage to be equal to the load voltage and before opening the first switch, opening the third switch to decouple the control voltage from the first switch.

11. A method according to claim 10, further comprising the steps of:

after closing the third switch, closing a fourth switch coupled between the output of the third switch and an input for the control voltage, and after opening the third switch, opening the fourth switch, the operation of the fourth switch compensating for voltage drop across the third switch.

* * * * *